(12) United States Patent
Fang et al.

(10) Patent No.: US 9,176,177 B2
(45) Date of Patent: Nov. 3, 2015

(54) ANTENNA CONTROL METHOD AND ANTENNA DEVICE USING THE SAME

(71) Applicant: Wistron NeWeb Corp., Hsinchu (TW)

(72) Inventors: Chen-Hung Fang, Hsinchu (TW); Chih-Wei Huang, Hsinchu (TW); Wen-Jiun Lin, Hsinchu (TW)

(73) Assignee: WISTRON NEWEB CORP, Hsinchu (TW)

( * ) Notice: Subject to any disclaimer, the term of this patent is extended or adjusted under 35 U.S.C. 154(b) by 237 days.

(21) Appl. No.: 14/044,286

(22) Filed: Oct. 2, 2013

(65) Prior Publication Data

US 2014/0091973 A1    Apr. 3, 2014

(30) Foreign Application Priority Data

Oct. 2, 2012  (TW) .................................. 101136367

(51) Int. Cl.
*G01R 29/10* (2006.01)
*H01Q 1/12* (2006.01)
*H01Q 1/22* (2006.01)
*H01Q 3/04* (2006.01)

(52) U.S. Cl.
CPC .............. *G01R 29/10* (2013.01); *H01Q 1/1257* (2013.01); *H01Q 1/2291* (2013.01); *H01Q 3/04* (2013.01)

(58) Field of Classification Search
CPC ..... G01R 29/10; H01Q 1/1257; H01Q 1/2291; H01Q 3/04
USPC .................................................. 343/703, 754
See application file for complete search history.

(56) References Cited

U.S. PATENT DOCUMENTS 5,448,248 A * 9/1995 Anttila .......................... 342/400

\* cited by examiner

*Primary Examiner* — Hoang V Nguyen
(74) *Attorney, Agent, or Firm* — Muncy, Geissler, Olds & Lowe P.C.

(57) ABSTRACT

The present invention provides an antenna control method and an antenna device. The method includes (A1) defining a plurality of rough scanning sectors in a signal region; (A2) rotating the antenna to each rough scanning sector to measure a first evaluation signal; (A3) selecting one of the plurality of rough scanning sectors in accordance with the first evaluation signals; (A4) defining a plurality of fine scanning sectors; (A5) rotating the antenna to the plurality of fine scanning sector corresponding to the selected rough scanning sector to measure a second evaluation signal; (A6) selecting one of the plurality of fine scanning sectors in accordance with the second evaluation signals; (A7) rotating the antenna to the selected fine scanning sector.

20 Claims, 4 Drawing Sheets

ANTENNA CONTROL METHOD AND ANTENNA DEVICE USING THE SAME

BACKGROUND OF THE INVENTION

1. Field of the Invention

This invention generally relates to an antenna control method and an antenna device using the same.

2. Description of the Prior Art

Following with the progress of electronic technology, a variety of portable electronic devices are widely used in our daily life. For connecting the portable electronic devices to the network and increasing the transmitting/receiving ability to provide better communication quality, the type and design of an antenna of a network access point have been gradually emphasized.

Rotary antennas are widely used because they are rotatable to adjust the direction of the antenna for making the antenna head toward a better direction having stronger signal and/or less interference to enhance the transmitting/receiving ability. However, users have to adjust the antenna to several directions manually, with many tries to find out the best direction. This kind of approach is time consuming and inconvenient. Moreover, the antenna is very likely unable to have the best performance since the manual adjustment is coarse and subjective.

SUMMARY OF THE INVENTION

It is an object of the present invention to provide an antenna control method for enhancing the transmitting/receiving ability and reducing the antenna adjusting time.

It is another object of the present invention to provide an antenna having better transmitting/receiving ability, less antenna adjusting time, and being more convenient in use.

The antenna control method of the present invention is for use with an antenna, wherein the antenna is rotatable in a signal region.

The method includes (A1) defining a plurality of rough scanning sectors in a signal region; (A2) rotating the antenna to each rough scanning sector to measure a first evaluation signal; (A3) selecting one of the plurality of rough scanning sectors in accordance with the first evaluation signals measured by the antenna in each rough scanning sector; (A4) defining a plurality of fine scanning sectors; (A5) rotating the antenna to each of the plurality of fine scanning sector corresponding to the selected rough scanning sector to measure a second evaluation signal; (A6) selecting one of the plurality of fine scanning sectors in accordance with the second evaluation signals measured by the antenna in each fine scanning sector corresponding to the selected rough scanning sector; and (A7) rotating the antenna to the selected fine scanning sector.

Step (A4) includes defining the plurality of fine scanning sectors in accordance with the selected rough scanning sector. The signal region includes a 360° all-angle area on a plane. The angles between the adjacent rough scanning sectors are equal. Step (A1) includes defining the plurality of rough scanning sectors by every 45° rotation as one sector, wherein the angles between the plurality of rough scanning sectors are 45°. On the other hand, at least two of the angles between the plurality of rough scanning sectors can be unequal. The angles between the selected rough scanning sector and the plurality of fine scanning sectors adjacent to the selected rough scanning sector are equal. Step (A4) includes defining the plurality of fine scanning sectors by every 15° rotation as one sector, wherein the angles between the plurality of fine scanning sector are 15°. Step (A4) includes defining the plurality of fine scanning sectors by every 7.5° rotation as one sector, wherein the angles between the plurality of fine scanning sector are 7.5°. On the other hand, at least two of the angles between the adjacent fine scanning sectors can be unequal.

The first evaluation signals and the second evaluation signals include reference signal receiving power (RSRP), reference signal receiving quality (RSRQ), signal to interference plus noise ratio (SINR), or receiving signal strength indication (RSSI). The kinds of first evaluation signal and the second evaluation signal can be the same or different.

A total processing time from step (A1) to step (A7) is less than 60 seconds. The antenna control method includes rotating the antenna by using a stepper motor. The antenna control method includes rotating the antenna in reverse directions respectively in step (A2) and step (A5).

The antenna device includes a rotation driving device and an antenna. The antenna is connected with the rotation driving device for rotating in a signal region and is controlled by the above mentioned method. The rotation driving device includes a stepper motor. A 360° all-angle area rotation is completed by the stepper motor with 2040 steps. The rotation driving device selectively rotates along a first direction or a second direction opposite to the first direction.

DETAILED DESCRIPTION OF THE PREFERRED EMBODIMENT

Figure 1:
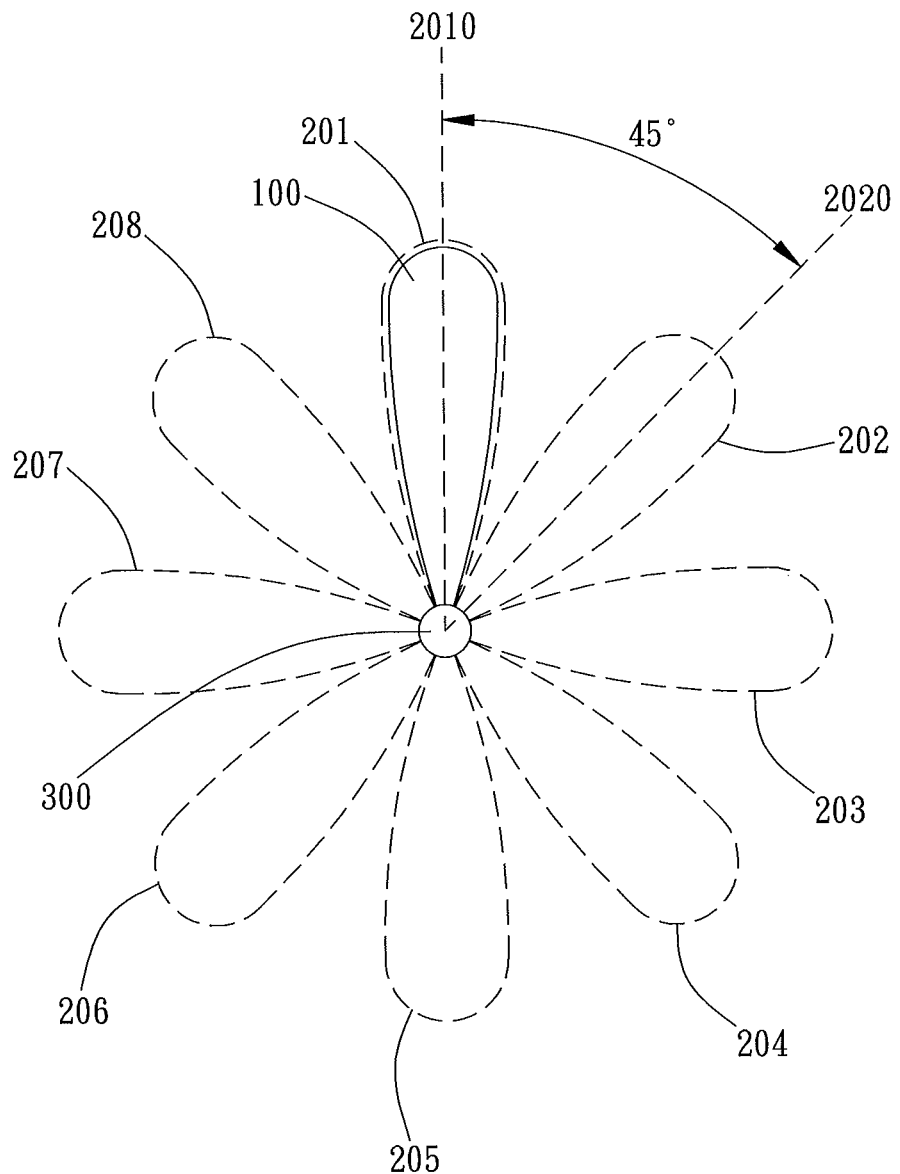
FIG. 1 is a schematic view of an embodiment of the present invention.

The antenna control method of the present invention is for use with an antenna, wherein the antenna is rotatable in a signal region. More particularly, as an embodiment shown in FIG. 1, the signal region includes a 360° all-angle area on a plane, wherein one end of an antenna 100 is connected to a rotation driving device 300 for rotating 360° in the signal region. In various embodiments, however, the signal is not limited to be a 360° all-angle area on a plane. As an embodiment shown in FIG. 2, the antenna device 800 having an antenna 100 is disposed in a corner formed by two walls 400. In this case, the signal region could be a 90° area 600 on a plane.

Figure 3:
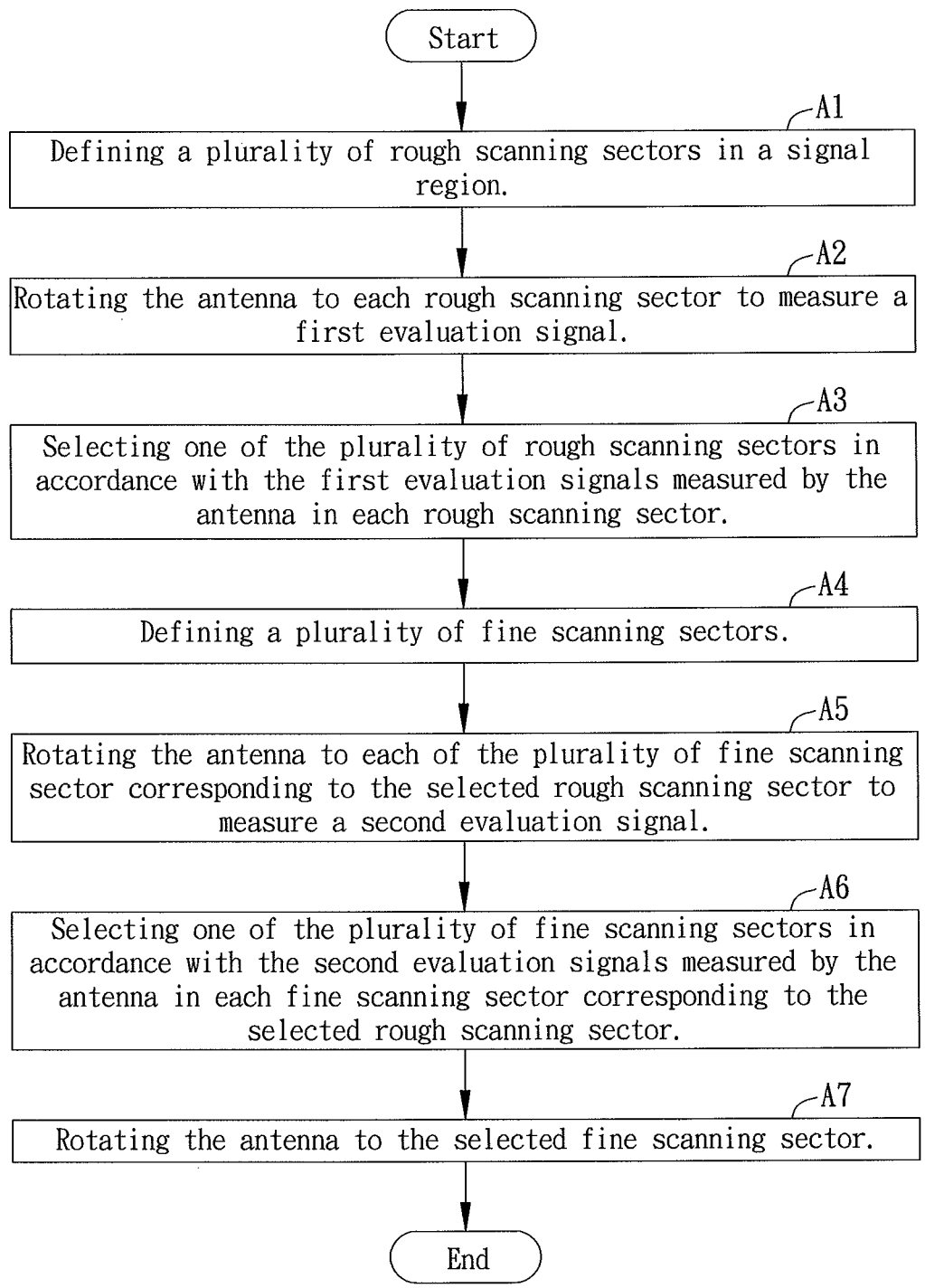
FIG. 3 is an exemplary flow chart of the present invention.

As shown in FIG. 3, the antenna control method of the present invention includes the following steps.

Figure 2:
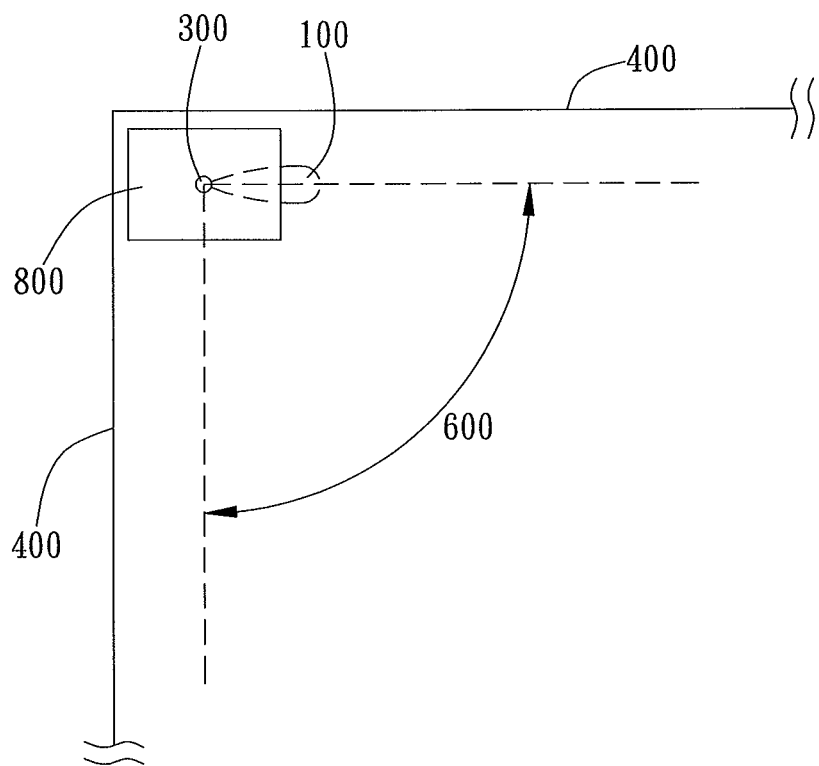
FIG. 2 is a schematic view of an embodiment of the present invention.

In step (A1), a plurality of rough scanning sectors in a signal region is defined. More particularly, as shown in FIG. 1, it is to define 8 rough scanning sectors, i.e. position 201, position 202, position 203, position 204, position 205, position 206, position 207, and position 208. The angles between the adjacent rough scanning sectors are 45°. In other words, if the rotating angle of the antenna 100 in position 201 is defined as 0, the antenna will be in position 202, position 203, position 204, position 205, position 206, position 207, and position 208 in sequence each time that it rotates 45°. In various embodiments, the number of the rough scanning sectors can be modified and is not limited to eight. On the other hand, in the embodiment, the angles between the adjacent rough scanning sectors are equal, which are all 45°. In various embodiments, however, at least two of the angles between the plurality of rough scanning sectors can be unequal. Taking an eight rough scanning sectors case as the example, in the angles between the rough scanning sectors, two of them can be 90° while the others can be 30°.

In step (A2), the antenna is rotated to each rough scanning sector to measure a first evaluation signal. In the embodiment shown in FIG. 1, the antenna 100 is rotated to the eight rough scanning sectors in sequence by the driving of the rotation driving device 300 and measures a first evaluation signal. The first evaluation signal includes reference signal receiving power (RSRP), reference signal receiving quality (RSRQ), signal to interference plus noise ratio (SINR), receiving signal strength indication (RSSI), and etc. In other embodiments, the antenna 100 is not limited to rotate to the eight rough scanning sectors in sequence and measures a first evaluation signal. For example, the antenna 100 can bypass the adjacent rough scanning sector and go to the next one to continue measuring the first evaluation signal after it measures the first evaluation signal in one of the rough scanning sector.

In step (A3), one of the plurality of rough scanning sectors is selected in accordance with the first evaluation signals measured by the antenna in each rough scanning sector. Take the embodiment shown in FIG. 1 as the example, if the first evaluation signal, such as RSRP, measured by the antenna 100 in the rough scanning sector of position 202 is stronger than that measured in other rough scanning sectors, selecting the rough scanning sector of position 202.

Figure 4:
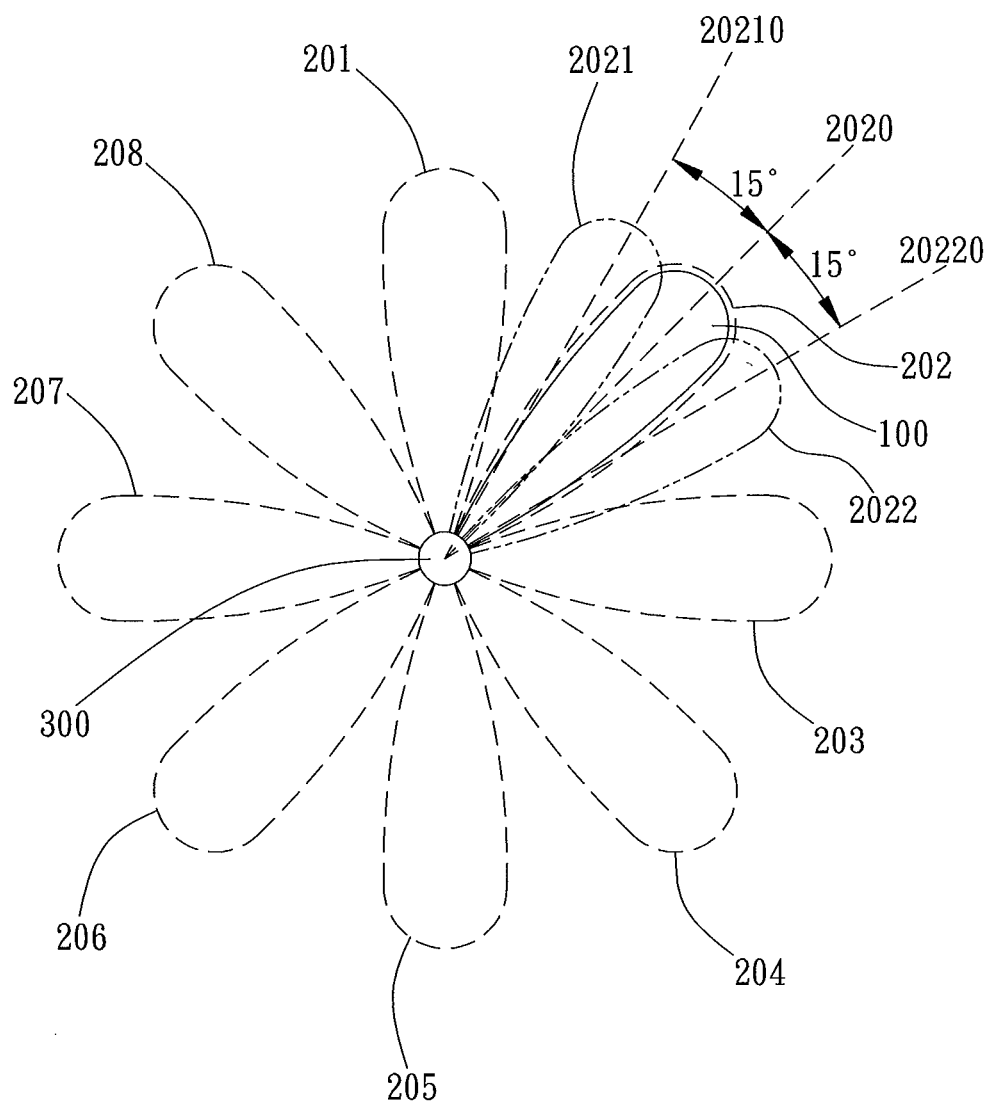
FIG. 4 is a schematic view of an embodiment indicating the fine scanning sectors of the present invention.

In step (A4), a plurality of fine scanning sectors is defined. More particularly, as an embodiment shown in FIG. 4, two fine scanning sectors, the left one (counter-clockwise) and the right one (clockwise), are defined in accordance with the rough scanning sector of position 202, wherein each of them has an angle of 15°. In other words, if the rotating angle of the antenna 100 in position 202 is defined as 0, the antenna will be in position 2021 after a 15° counter-clockwise rotation and in position 2022 after a 15° clockwise rotation. The positions 2021 and 2022 are said fine scanning sectors. In various embodiments, the number of the fine scanning sectors can be modified and is not limited to one in the left and one in the right. For example, the number of the fine scanning sectors can be two in the left and two in the right. On the other hand, in the embodiment, the angles between the selected rough scanning sector and the plurality of fine scanning sector adjacent to the selected rough scanning sector are equal. Specifically, the angle between the extending line 2020 of position 202 and the extending line 20210 of position 2021 and the angle between the extending line 2020 of position 202 and the extending line 20220 of position 2022 are both 15°. In other embodiments, however, the angles between the selected rough scanning sector and the adjacent plurality of fine scanning sector can be modified, for example reduced to 7.5° to increase the accuracy. At least two of the angles between the adjacent fine scanning sectors can be unequal. In the embodiment shown in FIG. 4, the plurality of fine scanning sectors are defined in accordance with the selected rough scanning sector. In various embodiments, however, the plurality of fine scanning sectors can be directly defined regardless of the selected rough scanning sector.

In step (A5), the antenna is rotated to each of the plurality of fine scanning sectors corresponding to the selected rough scanning sector to measure a second evaluation signal. As the embodiment shown in FIG. 4, the antenna 100 is rotated clockwise in sequence to two fine scanning sectors in positions 2021 and 2022 and measures the second evaluation signal. The first evaluation signal includes reference signal receiving power (RSRP), reference signal receiving quality (RSRQ), signal to interference plus noise ratio (SINR), receiving signal strength indication (RSSI), and etc. In various embodiments, the antenna 100 is not limited to rotate clockwise in sequence to the above two fine scanning sectors and measures the second evaluation signal. The antenna 100 is able to rotate counter-clockwise, wherein the number of fine scanning sectors for measure the second evaluation signal can be modified. In the embodiment, for simplify the kinds of the measured signals, the kinds of the first evaluation signal and the second evaluation signal can be the same. In other embodiments, however, for reasons such as enhancing the evaluation efficiency, the kinds of the first evaluation signal and the second evaluation signal can be the different kinds.

In step (A6), one of the plurality of fine scanning sectors is selected in accordance with the second evaluation signals measured by the antenna in each fine scanning sector corresponding to the selected rough scanning sector. Take the embodiment shown in FIG. 4 as the example, if the second evaluation signal, such as RSRP, measured by the antenna 100 in the fine scanning sector of position 2021 is stronger than that measured in other fine scanning sectors, selecting the fine scanning sector of position 2021.

In step (A7), the antenna is rotated to the selected fine scanning sector. More particularly, if the fine scanning sector of position 2021 is selected in step (A6), the antenna 100 is rotated to the fine scanning sector of position 2021 by the driving of the rotation driving device 300.

In sum, it is to measure a first evaluation signal in the rough scanning sectors having relatively wider measuring area to select one of the rough scanning sectors in steps (A1) to (A3). Then, in steps (A4) to (A6), it further measures the second evaluation signal in the fine scanning sectors defined in the selected rough scanning sector to select one of the fine scanning sectors. The antenna then rotates to the selected fine scanning sector in step (A7). Comparing to prior arts, with the method of the present invention, the antenna adjusting time can be reduced since the antenna of the antenna device can proceeds a rough scanning followed by a fine scanning and then rotates to a better direction more rapidly. Moreover, since the determination of better position is more objective due to that the rough scanning sector and the fine scanning sector are respectively selected in accordance with the first evaluation signal and the second evaluation signal, the antenna is able to perform better transmitting/receiving ability. On the other hand, the antenna of the antenna device rotates to a better direction automatically, instead manually, hence makes it is more convenient for use.

In the embodiment, a total processing time from step (A1) to step (A7) is less than 60 seconds. The antenna control method includes rotating the antenna by a stepper motor. A 360° all-angle area rotation is completed by the stepper motor with 2040 steps. More particularly, a stepper motor is used for its tiny rotation angle. Therefore, a motor alone with a plurality of gear wheels also can be used to attend tiny rotation angle. The antenna control method includes rotating the antenna in reverse directions respectively in step (A2) and step (A5) to avoid wire jamming.

Although the embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An antenna control method for use with an antenna, wherein the antenna is rotatable in a signal region, the method comprising:
   (A1) defining a plurality of rough scanning sectors in the signal region;
   (A2) rotating the antenna to each of the rough scanning sectors to measure a first evaluation signal;
   (A3) selecting one of the plurality of rough scanning sectors in accordance with the first evaluation signals measured by the antenna in each rough scanning sector;
   (A4) defining a plurality of fine scanning sectors;
   (A5) rotating the antenna to each of the plurality of fine scanning sectors corresponding to the selected rough scanning sector to measure a second evaluation signal;
   (A6) selecting one of the plurality of fine scanning sectors in accordance with the second evaluation signals measured by the antenna in each fine scanning sector corresponding to the selected rough scanning sector; and
   (A7) rotating the antenna to the selected fine scanning sector.

2. The antenna control method of claim 1, wherein step (A4) includes defining the plurality of fine scanning sectors in accordance with the selected rough scanning sector.

3. The antenna control method of claim 1, wherein the signal region includes a 360° all-angle area on a plane.

4. The antenna control method of claim 1, wherein angles between the adjacent rough scanning sectors are equal.

5. The antenna control method of claim 4, wherein step (A1) includes defining the plurality of rough scanning sectors by every 45° rotation as one sector, wherein the angles between the plurality of rough scanning sector are 45°.

6. The antenna control method of claim 1, wherein at least two of the angles between the adjacent rough scanning sectors are unequal.

7. The antenna control method of claim 1, wherein angles between the selected rough scanning sector and the plurality of fine scanning sector adjacent to the selected rough scanning sector are equal.

8. The antenna control method of claim 7, wherein step (A4) includes defining the plurality of fine scanning sectors by every 15° rotation as one sector, wherein the angles between the plurality of fine scanning sector are 15°.

9. The antenna control method of claim 7, wherein step (A4) includes defining the plurality of fine scanning sectors by every 7.5° rotation as one sector, wherein the angles between the plurality of fine scanning sector are 7.5°.

10. The antenna control method of claim 1, wherein at least two of the angles between the adjacent fine scanning sectors are unequal.

11. The antenna control method of claim 1, wherein the first evaluation signal includes reference signal receiving power (RSRP), reference signal receiving quality (RSRQ), signal to interference plus noise ratio (SINR), or receiving signal strength indication (RSSI).

12. The antenna control method of claim 1, wherein the second evaluation signal includes reference signal receiving power (RSRP), reference signal receiving quality (RSRQ), signal to interference plus noise ratio (SINR), or receiving signal strength indication (RSSI).

13. The antenna control method of claim 1, wherein the kinds of the first evaluation signal and the second evaluation signal are the same.

14. The antenna control method of claim 1, wherein the kinds of the first evaluation signal and the second evaluation signal are different.

15. The antenna control method of claim 1, wherein a total processing time from step (A1) to step (A7) is within 60 seconds.

16. The antenna control method of claim 1, further includes rotating the antenna by using a stepper motor.

17. The antenna control method of claim 1, further includes rotating the antenna in reverse directions respectively in step (A2) and step (A5).

18. An antenna device, comprising:
   a rotation driving device; and
   an antenna connected with the rotation driving device for rotating in a signal region and controlled by a method as claimed in claim 1.

19. The antenna device of claim 18, wherein the rotation driving device includes a stepper motor.

20. The antenna device of claim 18, wherein the rotation driving device selectively rotates along a first direction or a second direction opposite to the first direction.

* * * * *